(12) United States Patent
Kumar et al.

(10) Patent No.: US 7,759,666 B2
(45) Date of Patent: Jul. 20, 2010

(54) 3D R/W CELL WITH REDUCED REVERSE LEAKAGE

(75) Inventors: Tanmay Kumar, Pleasanton, CA (US); Christopher J. Petti, Mountain View, CA (US)

(73) Assignee: SanDisk 3D LLC, Milpitas, CA (US)

( * ) Notice: Subject to any disclaimer, the term of this patent is extended or adjusted under 35 U.S.C. 154(b) by 150 days.

(21) Appl. No.: 11/819,989

(22) Filed: Jun. 29, 2007

(65) Prior Publication Data

US 2009/0001347 A1    Jan. 1, 2009

(51) Int. Cl.
*H01L 29/02* (2006.01)
(52) U.S. Cl. .................. 257/2; 257/3; 257/4; 257/5
(58) Field of Classification Search .................. 257/1–5; 438/102–103; 365/202
See application file for complete search history.

(56) References Cited

U.S. PATENT DOCUMENTS

| | | | |
|---|---|---|---|
| 4,646,266 A | 2/1987 | Ovshinsky et al. |
| 4,665,428 A | 5/1987 | Hockley et al. |
| 4,914,055 A | 4/1990 | Gordon et al. |
| 5,432,729 A | 7/1995 | Carson et al. |
| 5,559,732 A | 9/1996 | Birge |
| 5,693,556 A | 12/1997 | Cleeves |
| 5,745,407 A | 4/1998 | Levy et al. |
| 5,751,012 A | 5/1998 | Wolstenholme et al. |
| 5,835,396 A | 11/1998 | Zhang |
| 5,915,167 A | 6/1999 | Leedy |
| 5,962,911 A | 10/1999 | Manley |
| 5,991,193 A | 11/1999 | Gallagher et al. |
| 6,034,882 A | 3/2000 | Johnson et al. |
| 6,111,784 A | 8/2000 | Nishimura et al. |
| 6,236,587 B1 | 5/2001 | Gudesen et al. |
| 6,306,718 B1 | 10/2001 | Singh et al. |
| 6,420,215 B1 | 7/2002 | Knall et al. |
| 6,483,736 B2 | 11/2002 | Johnson et al. |
| 6,486,065 B2 | 11/2002 | Vyvoda et al. |
| 6,525,953 B1 | 2/2003 | Johnson |
| 6,541,312 B2 | 4/2003 | Vyvoda et al. |
| 6,567,301 B2 | 5/2003 | Anthony et al. |
| 6,584,029 B2 | 6/2003 | Tran et al. |
| 6,677,220 B2 | 1/2004 | Van Brocklin et al. |
| 6,693,823 B2 | 2/2004 | Brown |
| 6,777,773 B2 | 8/2004 | Knall |
| 6,881,994 B2 | 4/2005 | Lee et al. |
| 6,946,719 B2 | 9/2005 | Petti et al. |

(Continued)

FOREIGN PATENT DOCUMENTS

EP    1 376 604 A1    1/2004

(Continued)

OTHER PUBLICATIONS

U.S. Appl. No. 10/095,962, filed Mar. 13, 2002, Herner et al.

(Continued)

*Primary Examiner*—Bradley K Smith
*Assistant Examiner*—Jami M Valentine
(74) *Attorney, Agent, or Firm*—Foley & Lardner LLP

(57) ABSTRACT

A nonvolatile memory device includes a semiconductor diode steering element, and a semiconductor read/write switching element.

15 Claims, 9 Drawing Sheets

U.S. PATENT DOCUMENTS

| | | | |
|---|---|---|---|
| 6,951,780 | B1 | 10/2005 | Herner |
| 6,952,030 | B2 | 10/2005 | Herner et al. |
| 6,952,043 | B2 | 10/2005 | Vyvoda et al. |
| 7,038,248 | B2 | 5/2006 | Lee |
| 7,176,064 | B2 | 2/2007 | Herner |
| 2001/0019301 | A1* | 9/2001 | Shibuya et al. ............... 338/308 |
| 2002/0081833 | A1* | 6/2002 | Li et al. ...................... 438/622 |
| 2003/0001230 | A1 | 1/2003 | Lowrey |
| 2004/0016991 | A1 | 1/2004 | Herner et al. |
| 2004/0228159 | A1 | 11/2004 | Kostylev et al. |
| 2004/0232509 | A1 | 11/2004 | Vyvoda et al. |
| 2005/0052915 | A1* | 3/2005 | Herner et al. ............... 365/202 |
| 2005/0098800 | A1 | 5/2005 | Herner et al. |
| 2005/0121742 | A1 | 6/2005 | Petti et al. |
| 2005/0158950 | A1 | 7/2005 | Scheuerlein et al. |
| 2006/0226459 | A1 | 10/2006 | Oh et al. |
| 2006/0250836 | A1 | 11/2006 | Herner et al. |
| 2006/0250837 | A1 | 11/2006 | Herner et al. |
| 2006/0268594 | A1 | 11/2006 | Toda |
| 2007/0069217 | A1 | 3/2007 | Herner |
| 2007/0069276 | A1 | 3/2007 | Scheuerlein et al. |
| 2007/0072360 | A1 | 3/2007 | Kumar et al. |
| 2007/0114508 | A1 | 5/2007 | Herner et al. |
| 2007/0114509 | A1 | 5/2007 | Herner |

FOREIGN PATENT DOCUMENTS

| | | |
|---|---|---|
| EP | 1 450 373 | 8/2004 |
| WO | WO 2004/055827 | 7/2004 |
| WO | WO 2006/078505 A2 | 7/2006 |

OTHER PUBLICATIONS

U.S. Appl. No. 10/185,507, filed Jun. 27, 2002, Vyvoda et al.
U.S. Appl. No. 10/440,882, filed May 19, 2003, Vyvoda et al.
U.S. Appl. No. 10/728,436, filed Dec. 5, 2003, Chen.
U.S. Appl. No. 10/728,451, filed Dec. 5, 2003, Cleeves et al.
U.S. Appl. No. 10/815,312, field Apr. 1, 2004, Chen.
U.S. Appl. No. 10/883,417, filed Jun. 30, 2004, Raghuram et al.
U.S. Appl. No. 10/954,510, filed Sep. 29, 2004, Herner.
U.S. Appl. No. 11/148,530, filed Jun. 8, 2006, Herner et al.
U.S. Appl. No. 11/395,995, filed Mar. 31, 2006, Herner et al.
U.S. Appl. No. 11/444,936, filed May 31, 2006, Radigan et al.
U.S. Appl. No. 11/693,858, filed Mar. 30, 2007, Kumar et al.
U.S. Appl. No. 11/819,895, filed Jun. 29, 2007, Kumar et al.
Alavi et al, "A PROM Element Based on Salicide Agglomeration of Poly Fuses in a CMOS Logic Process", IEDM 1997.
Amemiya et al., "Electrical Trimming of Heavily Doped Polycrystalline Silicon Resistors", IEEE Transactions Electron Devices, vol. Ed-26, No. 11, Nov. 1979.
Babcock, J. A. et al., "Polysilicon Resistor Trimming for Packaged Integrated Circuits", IEDM 93, 1993, pgs. 247-250.
Babcock, J. A. et al., "Precision Electrical Trimming of Very Low TCR Poly-Sige Resistors," IEEE Service Center, vol. 21, No. 6, Jun. 2000, pp. 283-285, abstract Figs. 2, 4.
Das, Soumen et al., "Electrical Trimming of Ion-Beam-Sputtered Polysilicon Resistors by High Current Pulses", IEEE Transaction of Electron Devices, vol. 41, No. 8, pp. 1429-1434, Aug. 1994.
Feldbaumer, D. W. et al., "Theory and Application of Polysilicon Resistor Trimming", Solid-State Electronics, vol. 38, No. 11, 1995, pp. 1861-1869.
Feldbaumer, D.W., "Pulse Current Trimming of Polysilicon Resistors", IEEE Transactions on Electron Devices, vol. 42, No. 4, pp. 689-696, Apr. 1995.
Kato, Kotaro et al., "A Monolithic 14 Bit D/A Converter Fabricated with a New Trimming Technique (DOT)", IEEE Journal of Solid-State Circuits, vol. SC-19, No. 5, pp. 802-804-806, Oct. 1984.
Kato, Kotaro et al., "A Physical Mechanism of Current-Induced Resistance Decrease in Heavily Doped Polysilicon Resistors", IEEE Transaction on Electron Devices, vol. ED-29, No. 8, pp. 1156-1160, Aug. 1982.
Kato, Kotaro et al., "Change in Temperature Coefficient of Resistance of Heavily Doped Polysilicon Resistors Caused by Electrical Trimming", Jpn. J. Appl. Phys., vol. 35, Part 1, No. 8, pp. 14209-4215, Aug. 1996.
Lane, William A., "The Design of Thin-Film Polysilicon Resistors for Analog IC Applications", IEEE Transactions on Electron Devices, vol. 36, No. 4, pp. 738-744, Apr. 1989.
Tobita, Toshio, "New Trimming Technology of a Thick Film Resistor by the Pulse Voltage Method", IEEE Transactions on Components, Hybrids and Manufacturing Technology, vol. 14, No. 3, pp. 613-617, Sep. 1991.
Office Action dated Jan. 7, 2010 received in U.S. Appl. No. 11/819,895.

* cited by examiner

3D R/W CELL WITH REDUCED REVERSE LEAKAGE

This application is related to Kumar et al., U.S. application Ser. No. 11/819,895, titled "METHOD OF MAKING 3D R/W CELL WITH REDUCED REVERSE LEAKAGE", filed on the same day herewith, and hereby incorporated by reference in its entirety.

BACKGROUND OF THE INVENTION

The invention relates to a nonvolatile memory device and a method of making the device.

Nonvolatile memory arrays maintain their data even when power to the device is turned off. In one-time-programmable arrays, each memory cell is formed in an initial unprogrammed state, and can be converted to a programmed state. This change is permanent, and such cells are not erasable. In other types of memories, the memory cells are erasable, and can be rewritten many times.

Cells may also vary in the number of data states each cell can achieve. A data state may be stored by altering some characteristic of the cell which can be detected, such as current flowing through the cell under a given applied voltage or the threshold voltage of a transistor within the cell. A data state is a distinct value of the cell, such as a data '0' or a data '1'.

Some solutions for achieving erasable or multi-state cells are complex. Floating gate and SONOS memory cells, for example, operate by storing charge, where the presence, absence or amount of stored charge changes a transistor threshold voltage. These memory cells are three-terminal devices which are relatively difficult to fabricate and operate at the very small dimensions required for competitiveness in modern integrated circuits.

Other memory cells operate by changing the resistivity of relatively exotic materials, like chalcogenides. Chalcogenides are difficult to work with and can present challenges in most semiconductor production facilities.

A substantial advantage would be provided by a nonvolatile memory array having erasable or multi-state memory cells formed using conventional semiconductor materials in structures that are readily scaled to small size.

SUMMARY OF THE PREFERRED EMBODIMENTS

One embodiment of the invention provides a nonvolatile memory device comprising a semiconductor diode steering element, and a semiconductor read/write switching element.

Another embodiment of the invention provides a nonvolatile memory device, comprising a semiconductor diode steering element, a semiconductor resistor read/write switching element, at least one conductive layer located between the steering element and the switching element, a first electrode electrically contacting the steering element; and a second electrode electrically contacting the switching element. The read/write switching element, the at least one conductive layer and the steering element are arranged in series in a pillar between the first electrode and the second electrode.

Another embodiment of the invention provides a nonvolatile memory device, comprising a semiconductor diode steering element, a semiconductor read/write switching element, at least one conductive layer located between the steering element and the switching element, and a means for switching the read/write switching element from a first resistivity state to a second resistivity state different from the first resistivity state and for switching the read/write switching element from the second resistivity state to the first resistivity state.

Each of the aspects and embodiments of the invention described herein can be used alone or in combination with one another. The preferred aspects and embodiments will now be described with reference to the attached drawings.

DETAILED DESCRIPTION OF THE PREFERRED EMBODIMENTS

It has been known that by applying electrical pulses, the resistance of a resistor formed of doped polycrystalline silicon, or polysilicon, can be trimmed, adjusting it between stable resistance states. Such trimmable resistors have been used as elements in integrated circuits.

Figure 1:
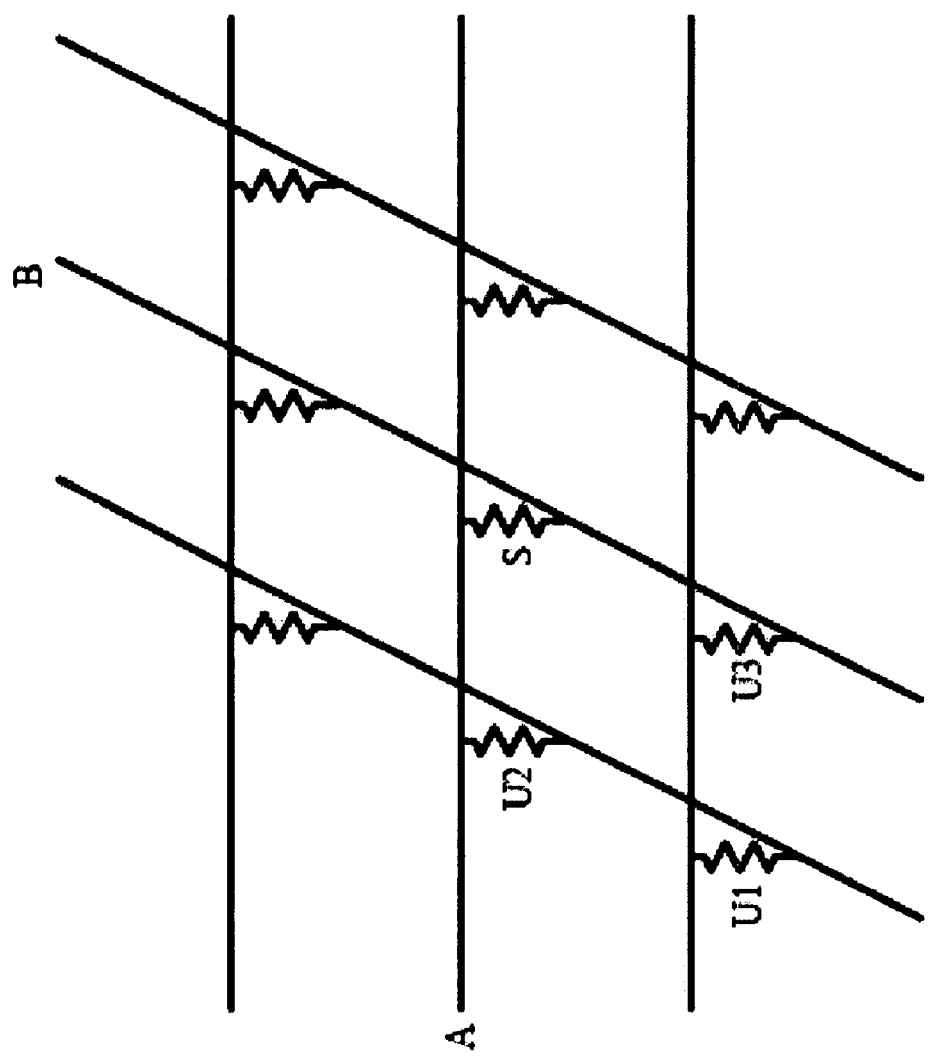
FIG. 1 is a circuit diagram illustrating the need for electrical isolation between memory cells in a memory array.

However, trimmable polysilicon resistors are not conventionally used to store a data state in a nonvolatile memory cell. Making a memory array of polysilicon resistors presents difficulties. If resistors are used as memory cells in a large cross-point array, when voltage is applied to a selected cell, there will be undesired leakage through half-selected and unselected cells throughout the array. For example, turning to FIG. 1, suppose a voltage is applied between bitline B and wordline A to set, reset, or sense selected cell S. Current is intended to flow through selected cell S. Some leakage current, however, may flow on alternate paths, for example between bitline B and wordline A through unselected cells U1, U2, and U3. Many such alternate paths may exist.

In one embodiment of the invention, the leakage current can be greatly reduced by forming each memory cell as a two-terminal device including a diode and a resistor. A diode has a non-linear I-V characteristic, allowing very little current flow below a turn-on voltage, and substantially higher current flow above the turn-on voltage. In general, a diode also acts as one-way valve passing current more easily in one direction than the other. Thus, so long as biasing schemes are selected that assure that only the selected cell is subjected to a forward current above the turn-on voltage, leakage current along unintended paths (such as the U1-U2-U3 sneak path of FIG. 1) can be greatly reduced.

In embodiments of the present invention, by applying appropriate electrical pulses, a memory element formed of semiconductor material, for example a diode steering element and a semiconductor resistor which functions as a read/write switching element, can achieve two or more stable resistivity states. The switching element is located in series, but preferably decoupled from the diode steering element. Preferably, the switching element is decoupled from the steering element by one or more conductive layers, such as metal (Ti, W, etc.), metal silicide or titanium nitride layers, which are located between the switching and steering elements. The switching element, the steering element and the conductive decoupling layer are arranged in series form a non-volatile memory cell. The switching element preferably comprises amorphous, polycrystalline or a combination amorphous and polycrystalline Group IV semiconductor resistor. However, other switching elements, such as high resistivity diodes can also be used. The steering element preferably comprises a crystallized, low resistivity polycrystalline Group IV semiconductor diode.

The semiconductor resistor material can be converted from an initial first resistivity state to a different resistivity state; then, upon application of an appropriate electrical pulse, can be returned to the first resistivity state. For example, the first state may be a higher resistivity state than the second state. Alternatively, the second state may be a lower state than the first resistivity state. The memory cell can have two or more data states, and can be one-time-programmable or rewriteable.

As noted, including a diode between conductors in the memory cell allows its formation in a highly dense cross-point memory array. In preferred embodiments of the present invention, then, a polycrystalline and/or amorphous semiconductor memory element is formed of the decoupled diode and the resistor in series.

Figure 2:
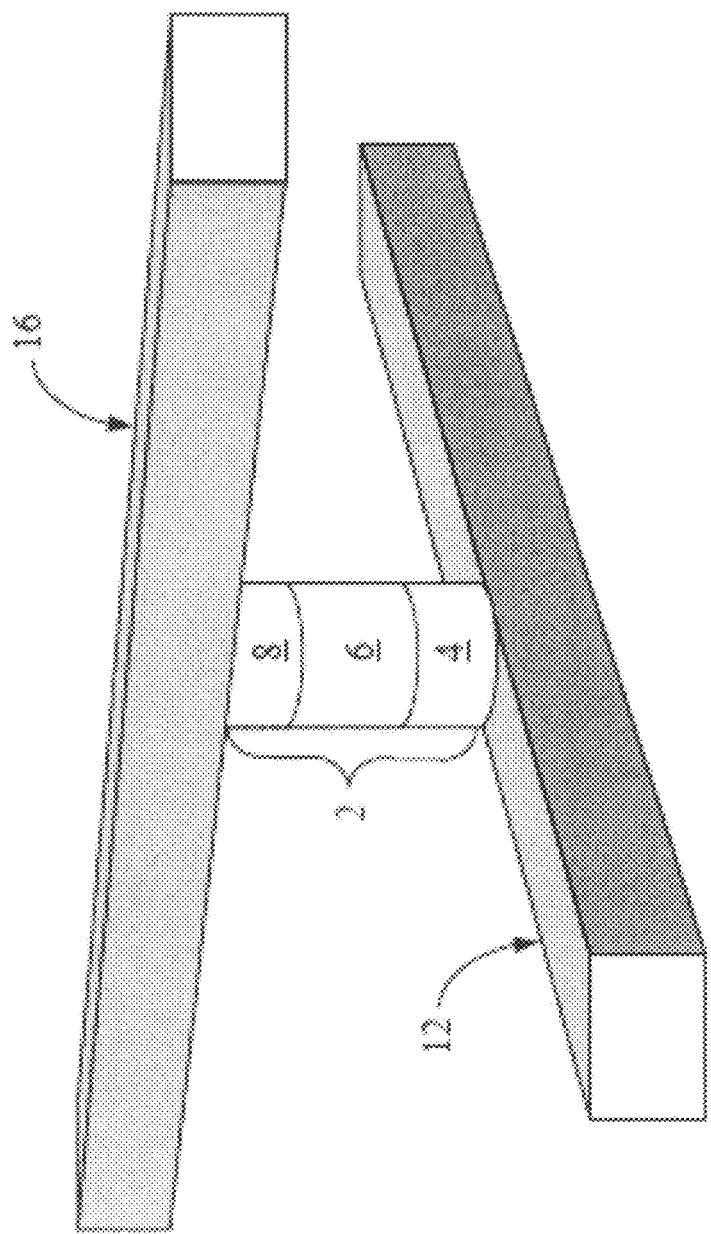
FIGS. 2 and 6 are perspective views of memory cells formed according to a preferred embodiment of the present invention.
Figure 3:
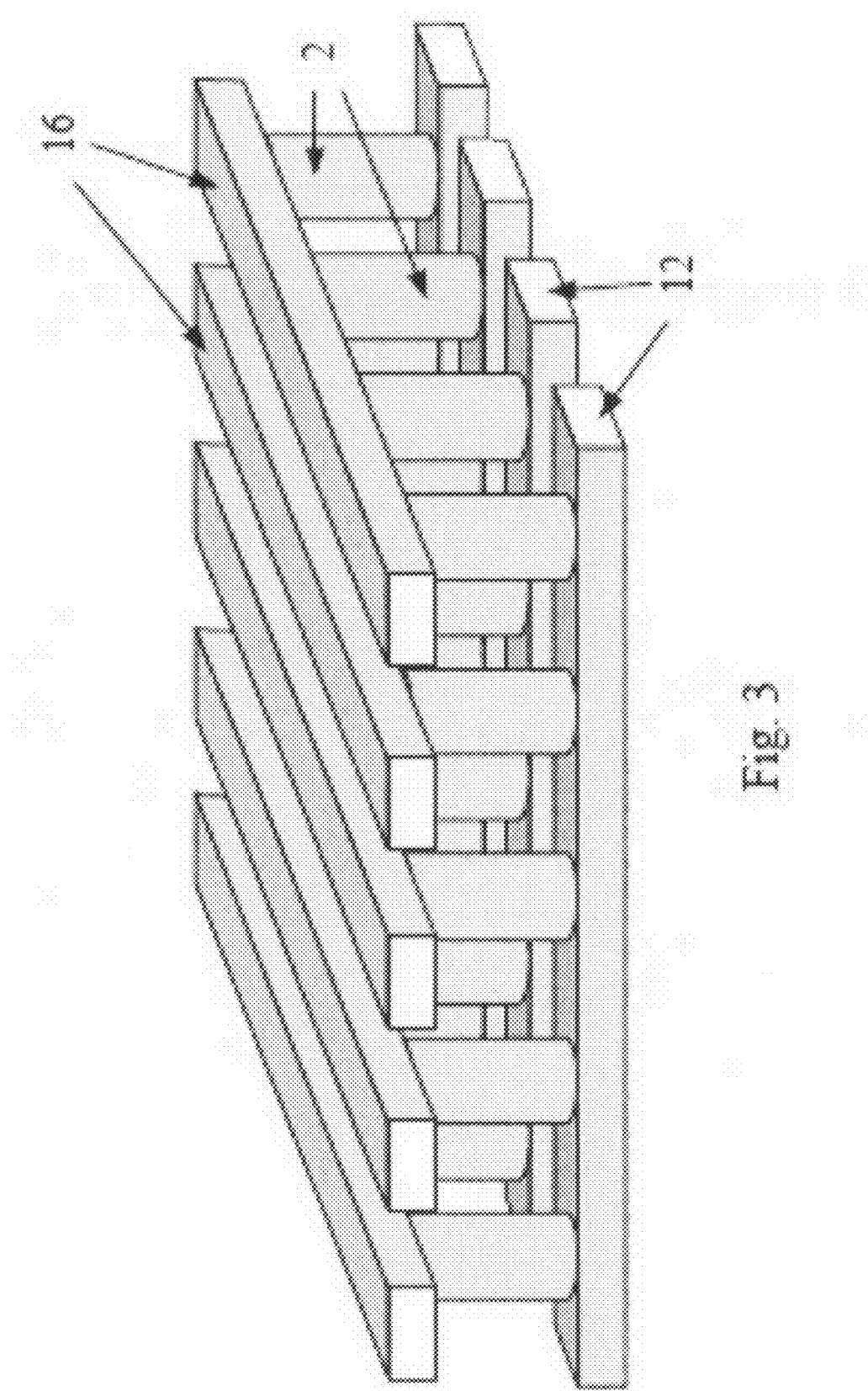
FIG. 3 is a perspective view of a portion of a memory level comprising the memory cells of FIG. 2.

FIG. 2 illustrates a memory cell 2 formed according to a preferred embodiment of the present invention. A bottom conductor 12 is formed of a conductive material, for example tungsten, and extends in a first direction. Barrier and adhesion layers may be included in bottom conductor 12. The memory cell 2 contains a polycrystalline semiconductor diode 4. The diode 4 preferably has a bottom heavily doped n-type region; an intrinsic region, which is not intentionally doped; and a top heavily doped p-type region, though the orientation of this diode may be reversed. Such a diode, regardless of its orientation, will be referred to as a p-i-n diode. The memory cell also contains one or more conductive "decoupler" layers 6, and an amorphous and/or polycrystalline semiconductor resistor 8. The order of elements in cell 2 may be reversed, and the resistor 8 may be located on the bottom of the cell and the diode 4 may be located on the top of the cell. Furthermore, the cell 2 may be positioned horizontally instead of vertically with respect to the substrate. Top conductor 16 may be formed in the same manner and of the same materials as bottom conductor 12, and extends in a second direction different from the first direction. Polycrystalline semiconductor diode 4 is vertically disposed between bottom conductor 12 and top conductor 16. Polycrystalline semiconductor diode 4 is preferably formed in a low-resistivity state. The resistor 8 is preferably, but not necessarily formed in a high-resistivity state. This memory cell can be formed above a suitable substrate, for example above a monocrystalline silicon wafer. FIG. 3 shows a portion of a memory level of such devices formed in a cross-point array, where cells 2 are disposed between bottom conductors 12 and top conductors 16. As shown in FIGS. 2 and 3, the diode and the resistor preferably have a substantially cylindrical shape. Multiple memory levels can be stacked over a substrate to form a highly dense monolithic three dimensional memory array.

Preferably, the memory cell 2 does not include any additional active devices, such as a transistor or a capacitor. However, if desired, the memory cell 2 may contain an optional passive device, such as a fuse, an antifuse, a charge storage material, or a phase change material. The memory cell may also contain an insulating material which surrounds the diode and the resistor, as will be described below, and other optional layers.

In this discussion, a region of semiconductor material which is not intentionally doped is described as an intrinsic region. It will be understood by those skilled in the art, however, that an intrinsic region may in fact include a low concentration of p-type or n-type dopants. Dopants may diffuse into the intrinsic region from adjacent regions, or may be present in the deposition chamber during deposition due to contamination from an earlier deposition. It will further be understood that deposited intrinsic semiconductor material (such as silicon) may include defects which cause it to behave as if slightly n-doped. Use of the term "intrinsic" to describe silicon, germanium, a silicon-germanium alloy, or some other semiconductor material is not meant to imply that this region contains no dopants whatsoever, nor that such a region is perfectly electrically neutral.

The memory cell comprises a read/write memory cell, such as a rewritable memory cell. The resistor 8 acts as the read/write element of the memory cell, by switching from a first resistivity state to a second resistivity state different from the first resistivity state in response to an applied bias (i.e., pulse) as will be explained in more detail below.

In this discussion, transition from a higher resistivity, unprogrammed state to a lower resistivity, programmed state will be called a set transition, affected by a set current, a set voltage, or a set pulse; while the reverse transition, from a lower resistivity, programmed state to a higher resistivity, unprogrammed state, will be called a reset transition, affected by a reset current, a reset voltage, or a reset pulse. The higher resistivity, unprogrammed state corresponds to a "1" memory state, while the lower resistivity, programmed state corresponds to a "0" memory state.

The resistivity of doped polycrystalline or microcrystalline semiconductor material, for example silicon, can be changed between stable states by applying appropriate electrical pulses. Generally a set pulse applied with the diode under forward bias which is sufficient to switch the resistor's semiconductor material from a given resistivity state to a lower resistivity state will have a lower voltage amplitude than a corresponding reset pulse (which will switch the same semiconductor material from the lower resistivity state to a higher resistivity state) and will have a longer pulse width than the reset pulse.

By selecting appropriate voltages, either set or reset of the semiconductor material making up the resistor can be achieved without also switching the resistivity state of the diode. Preferably the current flows in the forward direction through the diode 4 (i.e., a forward bias is applied) for both the set and reset transitions of the resistor 8. One or more conventional driver circuits connected to the electrodes 12, 16 may be used to apply electrical pulse(s) to the read/write switching resistor element 8 for programming and reading the memory cell 2.

Thus, in use, the read/write switching resistor element 8 of the memory cell 2 switches from a first resistivity state to a second resistivity state different from the first resistivity state in response to an applied electrical pulse. If desired, an application of a second electrical pulse can switch the read/write switching resistor element 8 from the second resistivity state back to the first resistivity state and/or to a third resistivity state different from the first and second resistivity states. However, the diode steering element 4 does not switch from the first resistivity state to the second resistivity state in response to the first applied electrical pulse. For example, the diode steering element 4 may be formed in a low resistivity state which does not change in response to the applied electrical pulse while the read/write switching resistor element 8 is formed in a high resistivity state which changes in response to the applied electrical pulse.

As will be explained in more detail below, the memory cell includes a metal silicide layer, such as titanium silicide, titanium germanide or titanium silicide-germanide layer, having the C49 phase, in physical contact with the diode 4. The silicide layer acts as a crystallization template for the semiconductor diode 4 such that the diode is fabricated in the low resistivity state. Without wishing to be bound by a particular theory, the low resistivity of the diode is believed to be a result of a large grain size of the polycrystalline semiconductor material that is crystallized in contact with the crystallization template. It is believed that a diode formed in the low resistivity state, such as by crystallization in contact with a silicide template, will not switch to a high resistivity state in response to an application of a forward bias across the diode. In contrast, the resistor 8 is preferably not formed in contact with a silicide template and is formed in a relatively high resistivity state. Thus, the resistor 8 can be switched to a lower resistivity state by an application of the forward bias across the diode and the resistor arranged in series.

Herner et al., U.S. patent application Ser. No. 11/148,530, "Nonvolatile Memory Cell Operating by Increasing Order in Polycrystalline Semiconductor Material," filed Jun. 8, 2006; and Herner, U.S. patent application Ser. No. 10/954,510, "Memory Cell Comprising a Semiconductor Junction Diode Crystallized Adjacent to a Silicide," filed Sep. 29, 2004, both owned by the assignee of the present invention and both hereby incorporated by reference, describe that crystallization of polysilicon adjacent to an appropriate silicide affects the properties of the polysilicon. Certain metal silicides, such as cobalt silicide and titanium silicide, have a lattice structure very close to that of silicon. When amorphous or microcrystalline silicon is crystallized in contact with one of these silicides, the crystal lattice of the silicide provides a template to the silicon during crystallization. The resulting polysilicon will be highly ordered, and relatively low in defects. This high-quality polysilicon, when doped with a conductivity-enhancing dopant, is relatively highly conductive as formed.

After application of the switching pulse, a smaller read pulse, for example 1.5 to 2 volts, is applied, and the current flowing through the diode and resistor at the read voltage, called the read current, is measured. As the voltage of the switching pulse is increased in subsequent pulses, the subsequent read current at a given read voltage changes. Thus, distinct data states of the memory cell of the embodiments of the present invention correspond to resistivity states of polycrystalline or microcrystalline semiconductor material making up the resistor, which are distinguished by detecting current flow through the memory cell (between top conductor 16 and bottom conductor 12) when a read voltage is applied. Preferably, there is at least a factor of two difference between the read current flowing in any one distinct data state and any different distinct data state such that the difference between the states is readily detectable. The read current through the memory cell is higher in the lower resistivity resistor set state than in the higher resistivity resistor reset state. The memory cell can be used as a one-time programmable cell or a rewriteable memory cell, and may have two, three, four, or more distinct data states. The cell can be converted from any of its data states to any other of its data states in any order. Examples of writing, reading and erasing memory cells is provided in U.S. application Ser. No. 11/496,986 filed on Jul. 31, 2006, which is a continuation-in part of U.S. application Ser. No. 11/237,167, filed on Sep. 28, 2005 and in U.S. application Ser. No. 11/693,845, filed on Mar. 30, 2007, and all of which are hereby incorporated by reference in their entirety.

So far, this discussion has described applying an appropriate electrical pulse to switch the semiconductor material of a resistor from one resistivity state to a different resistivity state, thus switching the memory cell between two distinct data states. In practice, these set and reset steps may be iterative processes. As described, the difference between current flow during read in adjacent data states is preferably at least a factor of two; in many embodiments, it may be preferred to establish current ranges for each data state which are separated by a factor of three, five, ten, or more. In some instances, however, it may be that after application of the electrical pulse, the read current is not in the desired range; i.e. the resistivity state of the semiconductor material of the resistor is higher or lower than intended. After an electrical pulse is applied to switch the memory cell to a desired data state, the memory cell may be read to determine if the desired data state was reached. If the desired data state was not reached, an additional pulse is applied. The additional pulse or pulses may have a higher or lower amplitude (voltage or current) or longer or shorter pulse width than the original pulse. After the additional set pulse, the cell is read again, then set or reset pulses are applied as appropriate until the read current is in the desired range. In a two-terminal device, such as the memory cell including a diode and resistor, it may be advantageous to read in order to verify the set or reset and to adjust if necessary.

Exemplary Method of Fabricating the Memory Cell

Fabrication of a single memory level will be described in detail. Additional memory levels can be stacked, each monolithically formed above the one below it. In this embodiment, a polycrystalline and/or amorphous semiconductor resistor will serve as the switchable memory element and the diode will serve as the steering element.

Figure 4A:
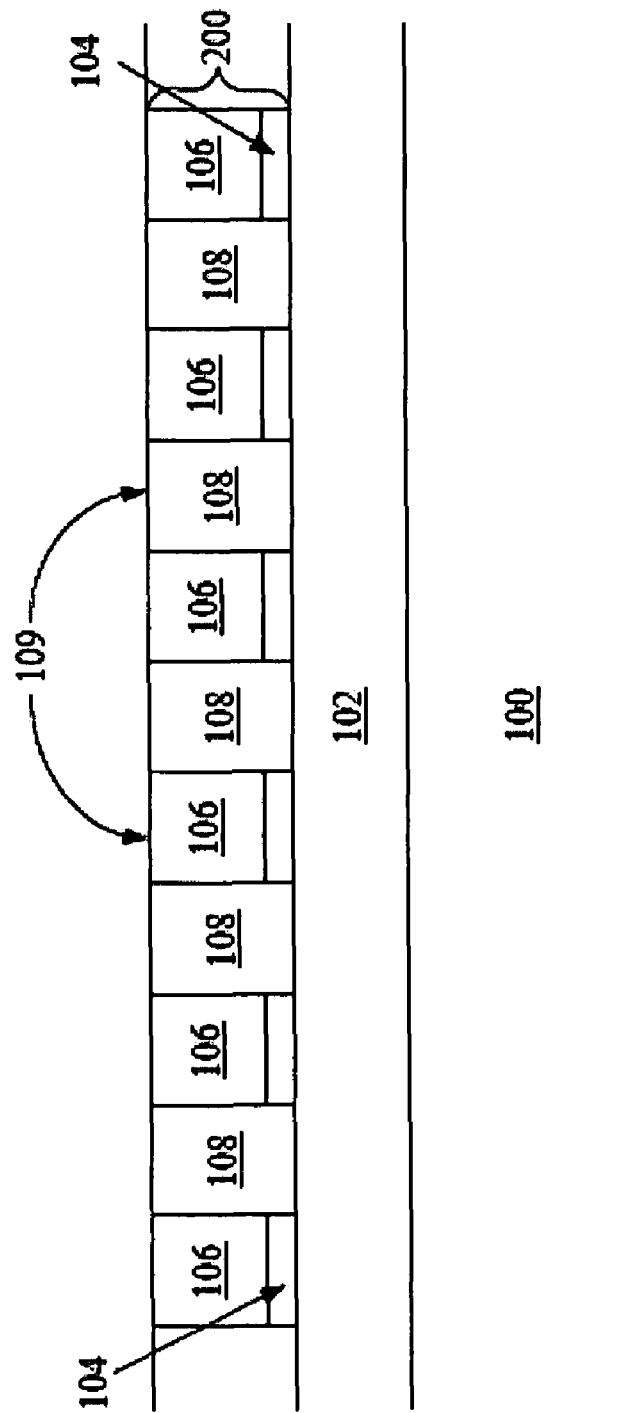
FIGS. 4a-4d are side cross-sectional views illustrating stages in formation of a memory level formed according to an embodiment of the present invention.

Turning to FIG. 4a, formation of the memory begins with a substrate 100. This substrate 100 can be any semiconducting substrate as known in the art, such as monocrystalline silicon, IV-IV compounds such as silicon-germanium or silicon-germanium-carbon, III-V compounds, II-VII compounds, epitaxial layers over such substrates, or any other semiconducting or non-semiconducting material. The substrate may include integrated circuits fabricated therein.

An insulating layer 102 is formed over substrate 100. The insulating layer 102 can be silicon oxide, silicon nitride, high-dielectric film, Si—C—O—H film, or any other suitable insulating material.

The first conductors 200 (i.e., the lower electrode 12 shown in FIG. 2) are formed over the substrate and insulator. An adhesion layer 104 may be included between the insulating layer 102 and the conducting layer 106 to help conducting layer 106 adhere to insulating layer 102. If the overlying conducting layer is tungsten, titanium nitride is preferred as adhesion layer 104.

The next layer to be deposited is conducting layer 106. Conducting layer 106 can comprise any conducting material known in the art, such as tungsten, or other materials, including tantalum, titanium, copper, cobalt, or alloys thereof.

Once all the layers that will form the conductor rails have been deposited, the layers will be patterned and etched using any suitable masking and etching process to form substantially parallel, substantially coplanar conductors 200, shown in FIG. 4a in cross-section. In one embodiment, photoresist is deposited, patterned by photolithography and the layers etched, and then the photoresist removed using standard process techniques. Conductors 200 could be formed by a Damascene method instead.

Next, a dielectric material 108 is deposited over and between conductor rails 200. Dielectric material 108 can be any known electrically insulating material, such as silicon oxide, silicon nitride, or silicon oxynitride. In a preferred embodiment, silicon dioxide is used as dielectric material 108.

Finally, excess dielectric material 108 on top of conductor rails 200 is removed, exposing the tops of conductor rails 200 separated by dielectric material 108, and leaving a substantially planar surface 109. The resulting structure is shown in FIG. 4a. This removal of dielectric overfill to form planar surface 109 can be performed by any process known in the art, such as chemical mechanical planarization (CMP) or etchback. An etchback technique that may advantageously be used is described in Raghuram et al., U.S. application Ser. No. 10/883,417, "Nonselective Unpatterned Etchback to Expose Buried Patterned Features," filed Jun. 30, 2004 and hereby incorporated by reference. At this stage, a plurality of substantially parallel first conductors have been formed at a first height above substrate 100.

Figure 4B:
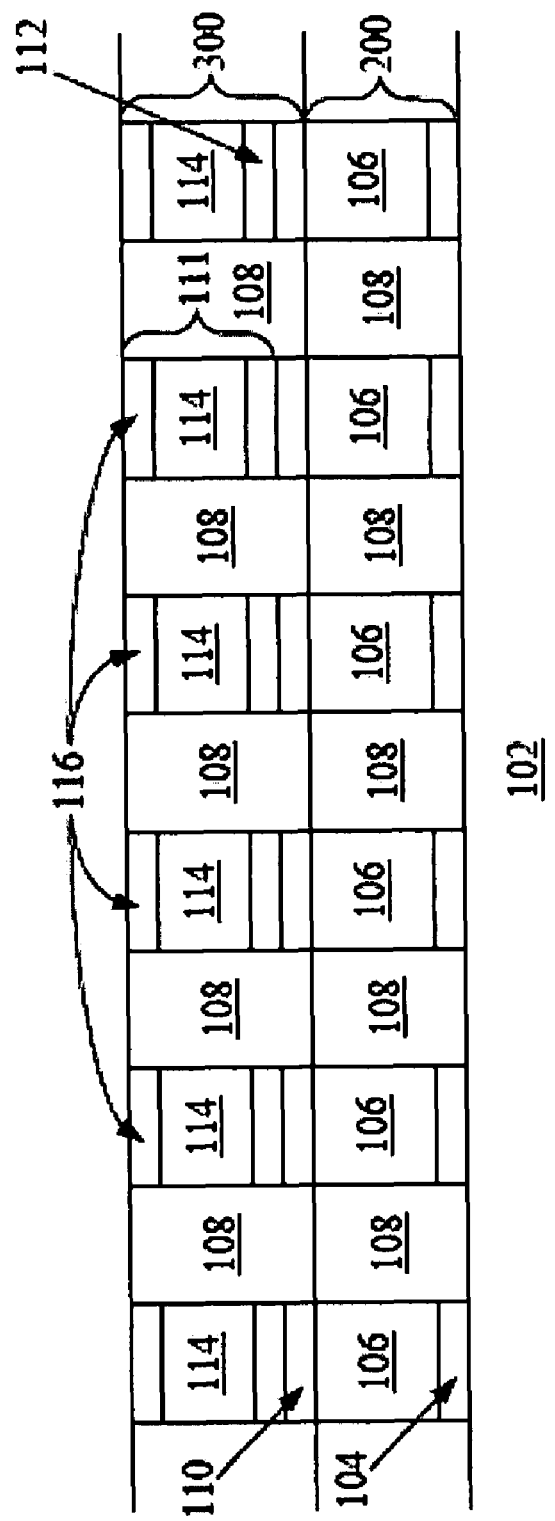

Next, turning to FIG. 4b, vertical pillars will be formed above completed conductor rails 200. (To save space substrate 100 is not shown in FIG. 4b; its presence will be assumed.) Preferably a barrier layer 110 is deposited as the first layer after planarization of the conductor rails. Any suitable material can be used in the barrier layer, including tungsten nitride, tantalum nitride, titanium nitride, or combinations of these materials. In a preferred embodiment, titanium nitride is used as the barrier layer. Where the barrier layer is titanium nitride, it can be deposited in the same manner as the adhesion layer described earlier.

Next semiconductor material that will be patterned into pillars is deposited. The semiconductor material can be silicon, germanium, a silicon-germanium alloy, or other suitable semiconductors, or semiconductor alloys. For simplicity, this description will refer to the semiconductor material as silicon, but it will be understood that the skilled practitioner may select any of these other suitable materials instead. Preferably, the semiconductor material is deposited in a relatively highly resistive amorphous or polycrystalline (which includes microcrystalline) state.

In preferred embodiments, the pillar comprises a semiconductor junction diode. The term junction diode is used herein to refer to a semiconductor device with the property of non-ohmic conduction, having two terminal electrodes, and made of semiconducting material which is p-type at one electrode and n-type at the other. Examples include p-n diodes and n-p diodes, which have p-type semiconductor material and n-type semiconductor material in contact, such as Zener diodes, and p-i-n diodes, in which intrinsic (undoped) semiconductor material is interposed between p-type semiconductor material and n-type semiconductor material.

Bottom heavily doped region 112 can be formed by any deposition and doping method known in the art. The silicon can be deposited and then doped, but is preferably doped in situ by flowing a donor gas providing n-type dopant atoms, for example phosphorus, during deposition of the silicon. Heavily doped region 112 is preferably between about 10 and about 80 nm thick.

Intrinsic layer 114 can be formed by any method known in the art. Layer 114 can be silicon, germanium, or any alloy of silicon or germanium and has a thickness between about 110 and about 330 nm, preferably about 200 nm.

Returning to FIG. 4b, semiconductor layers 114 and 112 just deposited, along with underlying barrier layer 110, can be patterned and etched to form pillars 300. Pillars 300 should have about the same pitch and about the same width as conductors 200 below, such that each pillar 300 is formed on top of a conductor 200. Some misalignment can be tolerated. As will be described in more detail below, the pillar 300 patterning and etching steps may also be delayed until further in the device fabrication process.

The pillars 300 can be formed using any suitable masking and etching process. For example, photoresist can be deposited, patterned using standard photolithography techniques, and etched, then the photoresist removed. Alternatively, a hard mask of some other material, for example silicon dioxide, can be formed on top of the semiconductor layer stack, with bottom antireflective coating (BARC) on top, then patterned and etched. Similarly, dielectric antireflective coating (DARC) can be used as a hard mask.

The photolithography techniques described in Chen, U.S. application Ser. No. 10/728,436, "Photomask Features with Interior Nonprinting Window Using Alternating Phase Shifting," filed Dec. 5, 2003; or Chen, U.S. application Ser. No. 10/815,312, Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the embodiments of the present invention.

The pitch and width of the pillars 300 can be varied as desired. In one preferred embodiment, the pitch of the pillars (the distance from the center of one pillar to the center of the next pillar) is about 300 nm, while the width of a pillar varies between about 100 and about 150 nm. In another preferred embodiment, the pitch of the pillars is about 260 nm, while the width of a pillar varies between about 90 and 130 nm. In general, the pillars preferably have a substantially cylindrical shape with a circular or roughly circular cross section having a diameter of 250 nm or less. A "substantially cylindrical" element is one with a cross section which is roughly circular; more specifically, a cross section in which no portion of the perimeter is a straight edge for a length longer than fifty percent of the longest dimension measured through the centroid of the cross-sectional area. Clearly, a straight edge will not be "straight" to a molecular level, and may have minute irregularities; what is relevant is the degree of rounding, as described in U.S. Pat. No. 6,952,030, incorporated herein by reference.

Dielectric material 108 is deposited over and between the semiconductor pillars 300, filling the gaps between them. Dielectric material 108 can be any known electrically insulating material, such as silicon oxide, silicon nitride, or silicon oxynitride. In a preferred embodiment, silicon dioxide is used as the insulating material.

Next the dielectric material on top of the pillars 300 is removed, exposing the tops of pillars 300 separated by dielectric material 108, and leaving a substantially planar surface. This removal of dielectric overfill can be performed by any process known in the art, such as CMP or etchback. The insulating layer 108 is planarized such that it surrounds the semiconductor region of the pillar 300. After CMP or etchback, ion implantation is performed, forming heavily doped p-type top region 116. The p-type dopant is preferably boron or $BF_2$. This implant step completes formation of diodes 111, as shown in FIG. 4b (the same diodes are numbered "4" in FIG. 2). Alternatively, region 116 may be deposited as a layer on layer 114 before the pillar patterning step rather than being implanted into layer 114. The resulting structure shown in FIG. 4b is also shown schematically in FIG. 5a.

Figure 5A:
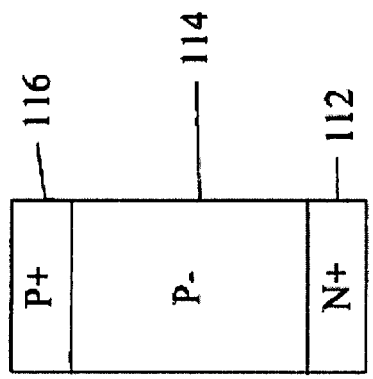
FIGS. 5a-5d are schematic side cross-sectional views illustrating alternative diode configurations according to an embodiment of the present invention.
Figure 5B:
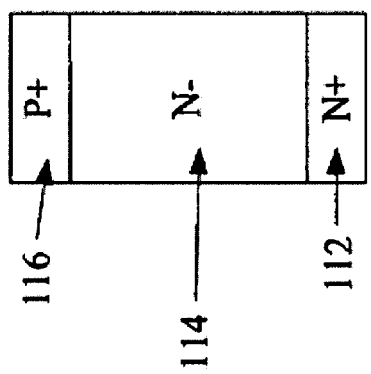
Figure 5C:
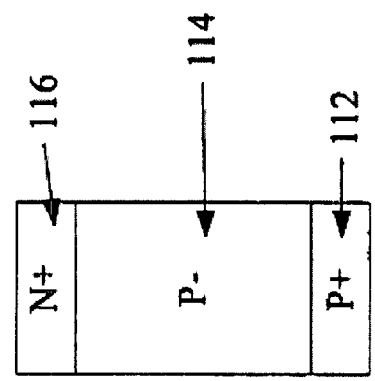
Figure 5D:
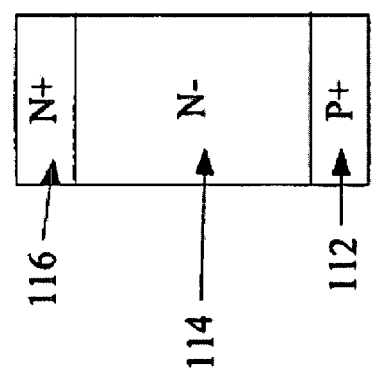

FIGS. 5b to 5d illustrate other permutations of diode structures. In the diodes of FIGS. 5a and 5b, bottom region 112 is N+ (heavily doped n-type silicon), and top region 116 is P+.

In the diodes of FIGS. 5c and 5d, bottom region 112 is P+ and top region 116 is N+. In FIGS. 5a and 5c, middle region 114 is N−, while in FIGS. 5b and 5d, middle region 114 is P−. The middle region can intentionally be lightly doped, or it can be intrinsic, or not intentionally doped. An undoped region will never be perfectly electrically neutral, and will always have defects or contaminants that cause it to behave as if slightly n-doped or p-doped. Such a diode can be considered a p-i-n diode. Thus, a P+/N−/N+, P+/P−/N+, N+/N−/P+ or N+/P−/P+ diode can be formed.

Figure 4C:
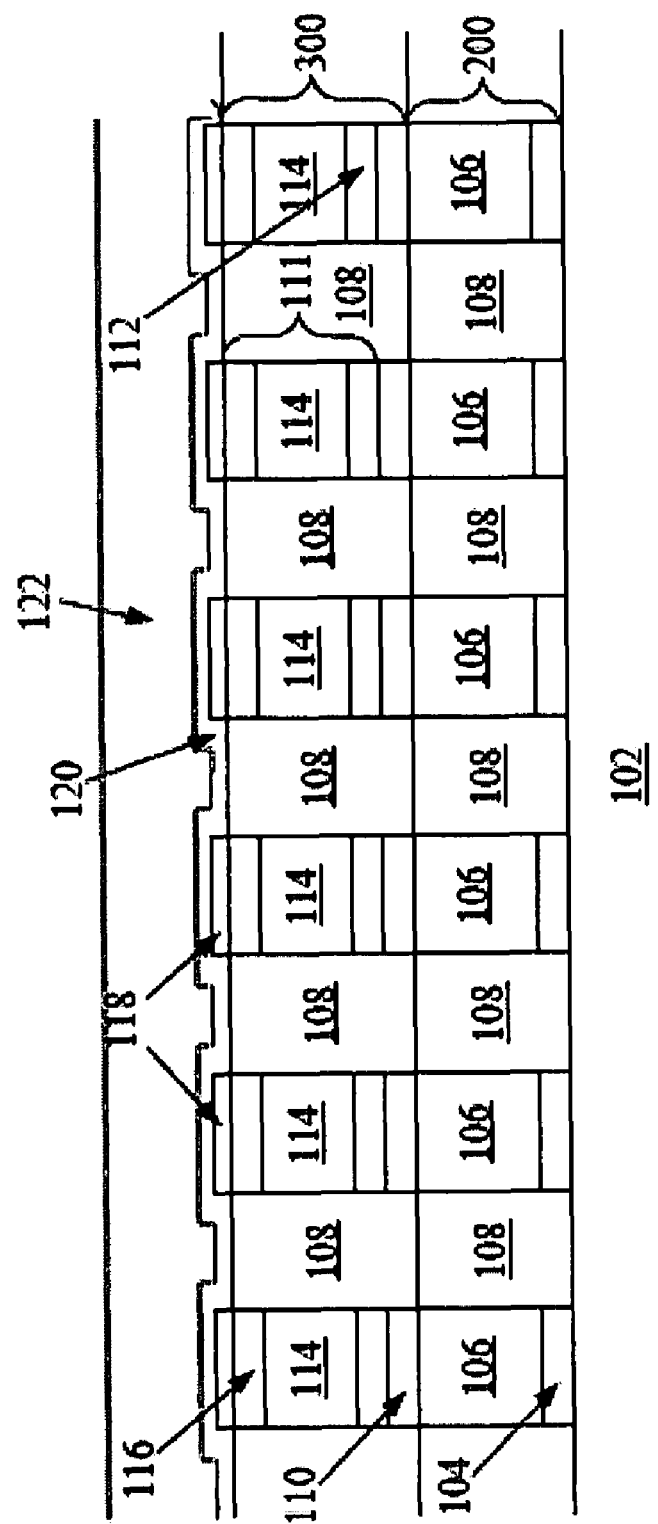

Turning to FIG. 4c, next an optional insulating oxide, nitride, or oxynitride layer 118 may be formed on heavily doped regions 116. Layer 118 will be reduced during formation of a titanium silicide layer 124 (but generally not other metal silicide layers), as will be described below. Alternatively, layer 118 may be omitted. For example, the optional silicon dioxide layer 118 is grown by oxidizing silicon at the tops of heavily doped regions 116 at about 600 to about 850° C. for about 20 seconds to about two minutes, forming between about 1 and about 5 nm of silicon dioxide. Preferably, oxide layer 118 is formed by exposing the wafer to about 800 degrees for about one minute in an oxygen-containing ambient. Layer 118 could be deposited instead.

Next, a layer 120 of a silicide-forming metal is deposited. Preferred silicide-forming metals to be used for this purpose include titanium or cobalt. This example will describe the use of titanium for layer 120, but it will be understood that other materials can be used.

Titanium layer 120 is deposited to any suitable thickness, for example between about 1 and about 20 nm, preferably between about 10 and about 15 nm, most preferably about 10 nm. To prevent oxidation of titanium layer 120, titanium nitride layer 122 is deposited, preferably about 30 nm thick. Layers 120 and 122 can be deposited by any conventional method, for example by sputtering.

An anneal is performed between about 600 and about 800° C. from about 10 seconds to about two minutes, preferably between about 650 degrees and about 750 degrees, most preferably at about 670 degrees for about 20 seconds, for example in nitrogen. The anneal serves to reduce oxide layer 118 and to react titanium layer 120 with heavily doped regions 116 where it overlies them to form titanium silicide. Oxide layer 118 is substantially entirely reduced between titanium layer 120 and the silicon of heavily doped region 116. If oxide layer 118 was deposited rather than grown, the rest of oxide layer 118 (between the tops of semiconductor pillars 300, overlying dielectric fill 108) would remain.

Figure 4D:
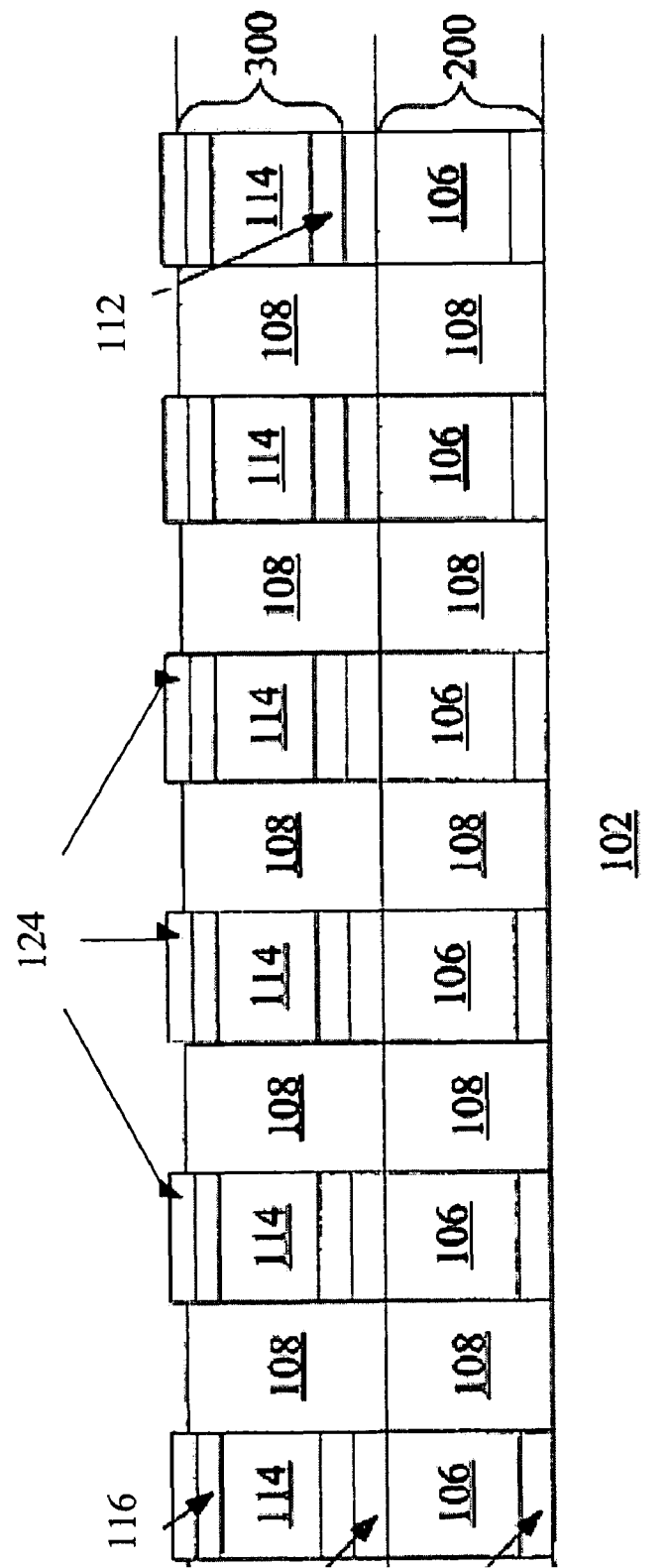

As in a conventional salicide process, titanium nitride layer 122 and unreacted titanium can stripped in a selective wet etch, leaving behind titanium silicide layers 124, each formed in a disk-shaped region on the top of one of the junction diodes, shown in FIG. 4d. Thereafter, one or more decoupler conductive layers 6 (shown in FIG. 2), such as a new titanium nitride layer are deposited on the silicide layer 124. Alternatively, the unreacted titanium layer 120 portions and the titanium nitride cap layer 122 are not removed after the silicide layer 124 formation, but are left in the device to act as the decoupler conductive layers 6.

In a preferred embodiment, the titanium silicide feature 124 that is formed during the anneal comprises C49 phase titanium silicide. The C49 phase can be obtained if the annealing temperature is maintained below 700 degrees C. for large or small sized silicon features or if the annealing temperature is maintained above 700 degrees C., but the silicon feature size is 0.25 microns or less. Thus, the diameter of the diode is preferably 0.25 microns or less to form the C49 phase of titanium silicide for annealing temperature above 700 degrees C. This phase is desired due to its lattice match with amorphous silicon during the crystallization process. In contrast larger features (greater than a dimensional size of 0.25 microns) will allow the titanium silicide to end as the C54 phase of titanium silicide during subsequent annealing above 700 degrees C. Even though the C54 phase provides low resistivity (which is highly desired by integrated circuit manufactures), it does not provide as good a lattice match during the crystallization process of the amorphous or polycrystalline silicon. Thus, the C49 phase titanium silicide allows for the greatest enhancement to grain growth and thus a lower diode resistivity by acting as a crystallization template for the semiconductor material of the diode.

As noted, in this example it is assumed that titanium is used in the silicide-forming metal layer 120, but other materials, including cobalt, could have been used instead. Thus, the titanium silicide layer 124 could instead be some other silicide, such as cobalt silicide.

In preferred embodiments, the junction diode is amorphous silicon as deposited, and is crystallized to form large grain, low resistivity polysilicon in contact with a silicide layer 124. The crystallization can occur during the formation of the silicide 124 and/or during a separate crystallization anneal after the memory cell is completed. The separate crystallization anneal may be conducted at a temperature above about 600° C., such as 650 to 850° C. for 1 or more minutes, such as 2 minutes to 24 hours, depending on the desired degree of crystallization. A lower temperature may be used for germanium and silicon germanium diode materials. The silicide layer 124 is advantageous for reducing the impedance of the junction diode, but may not be desired in the finished device. In an alternative embodiment, following formation of the silicide layer on the junction diode, the silicide layer can be removed.

After the formation of the one or more conductive decoupler layer(s) 120, 122 and/or 124, the semiconductor material that will be patterned into the resistor 8 is deposited on the conductive layer(s). The semiconductor material layer that will be patterned into the resistor 8 may be about 10 nm to about 40 nm thick, for example about 20 nm thick. The semiconductor material can be silicon, germanium, a silicon-germanium alloy, or other suitable semiconductors, or semiconductor alloys. For simplicity, this description will refer to the semiconductor material as silicon, but it will be understood that the skilled practitioner may select any of these other suitable materials instead. Preferably, the semiconductor material is deposited in a relatively highly resistive amorphous or polycrystalline (which includes microcrystalline) state. Preferably, the semiconductor material is deposited onto the conductive material, such as titanium nitride 122, which does not function as a crystallization template. Therefore, during the crystallization anneal, the diode 4 which is in contact with the crystallization template material 124, is crystallized into a lower resistivity, larger grain size state than the resistor 8 which is not in contact with the crystallization template material 124.

The resistor 8 material is preferably but not necessarily an intrinsic (undoped) semi conductor material or a lightly doped semiconductor material (having a p or n-type dopant concentration below $1 \times 10^{17}$ cm$^{-1}$). If the resistor material is lightly doped, then it can be formed by any deposition and doping method known in the art. The silicon can be deposited and then doped, but is preferably doped in situ by flowing a donor gas providing p or n-type dopant atoms, for example boron or phosphorus, during deposition of the silicon.

The decoupler 6 and/or resistor 8 layers are then patterned to form the upper portion of the pillar 300. The patterning may comprise a separate photolithography and etching steps from those used to pattern of the diode 4 into the lower portion of the pillar 300 described above.

In an alternative embodiment, the decoupler 6 and resistor 8 layers may be patterned during the same photolithography and etching steps as the diode 4 layers to form the pillar 300 in one patterning step. In this embodiment, the pillar 300 photolithography and etching steps are delayed until the resistor 8 layer is deposited. The formation and planarization of the dielectric material 108 is performed after the pillar 300 formation. If desired, the silicidation step used to form the silicide 124 and/or the diode crystallization annealing step may be delayed until after the entire pillar 300, including the resistor 8 portion, is patterned. In this case, the titanium nitride layer 122 acts as both a capping layer for silicide layer 124 formation and as a decoupler layer 6 located between the diode 4 and resistor 8.

Figure 6:
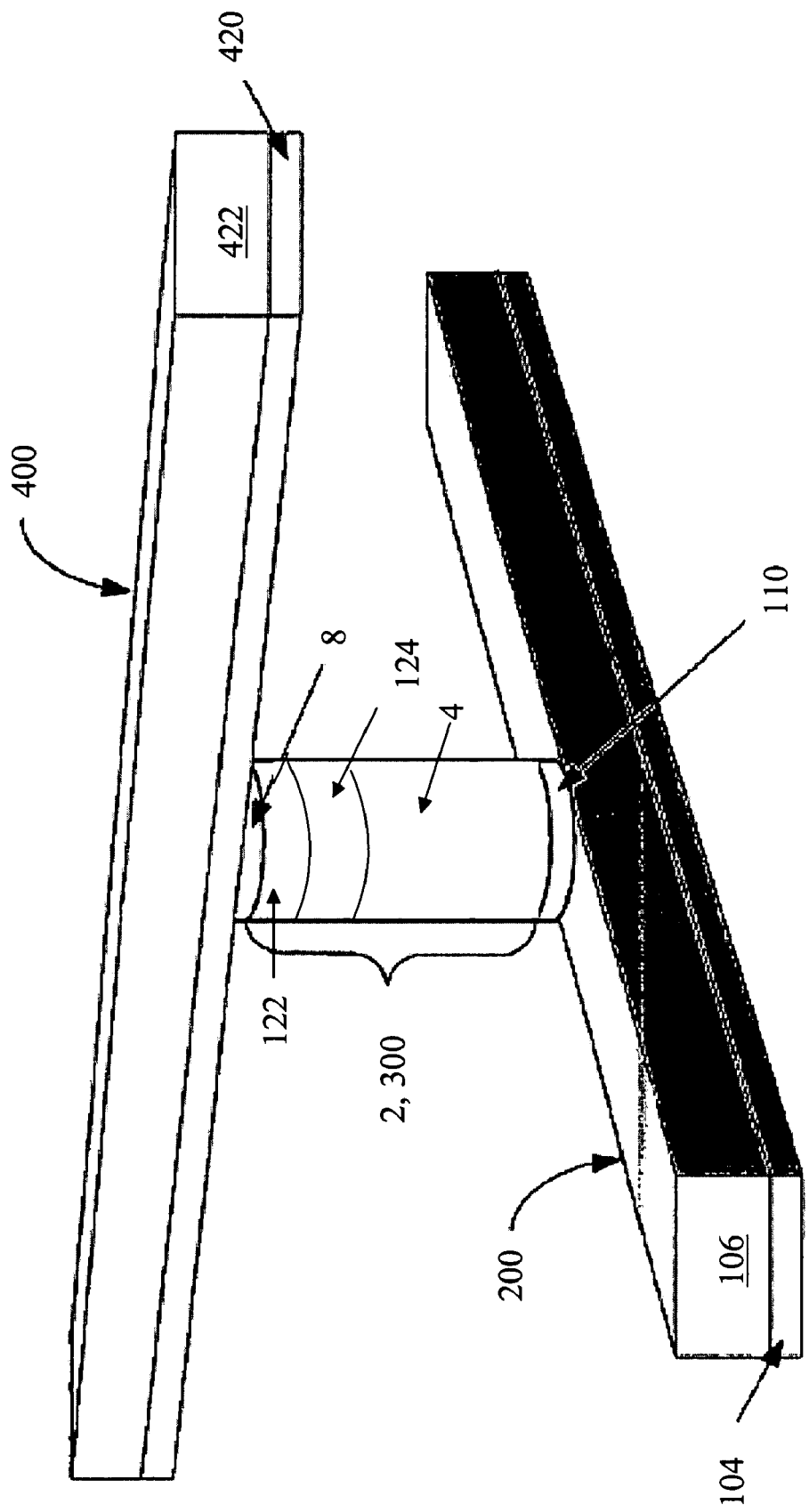

FIG. 6 illustrates a completed memory cell. Top conductors 400 (i.e., the upper electrode 16 shown in FIG. 2) can be formed in the same manner as bottom conductors 200, for example by depositing adhesion layer 420, preferably of titanium nitride, and conductive layer 422, preferably of tungsten. Conductive layer 422 and adhesion layer 420 are then patterned and etched using any suitable masking and etching technique to form substantially parallel, substantially coplanar conductors 400, shown in FIG. 6 extending perpendicular to conductors 200. In a preferred embodiment, photoresist is deposited, patterned by photolithography and the layers etched, and then the photoresist removed using standard process techniques. If desired, the adhesion layer 420 may be patterned together with the pillars 300 and may be located only on the pillars 300, while the conductive layer 422 comprises a rail that contacts each portion of the adhesion layer 420 on each pillar 300.

Next a dielectric material (not shown) is deposited over and between conductor rails 400. The dielectric material can be any known electrically insulating material, such as silicon oxide, silicon nitride, or silicon oxynitride. In a preferred embodiment, silicon oxide is used as this dielectric material.

Formation of a first memory level has been described. Additional memory levels can be formed above this first memory level to form a monolithic three dimensional memory array. In some embodiments, conductors can be shared between memory levels; i.e. top conductor 400 would serve as the bottom conductor of the next memory level. In other embodiments, an interlevel dielectric (not shown) is formed above the first memory level of FIG. 6, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

Monolithic three dimensional memory arrays are described in Johnson et al., U.S. Pat. No. 6,034,882, "Vertically stacked field programmable nonvolatile memory and method of fabrication"; Johnson, U.S. Pat. No. 6,525,953, "Vertically stacked field programmable nonvolatile memory and method of fabrication"; Knall et al., U.S. Pat. No. 6,420,215, "Three Dimensional Memory Array and Method of Fabrication"; Herner, U.S. application Ser. No. 10/095,962, "Silicide-Silicon Oxide-Semiconductor Antifuse Device and Method of Making," filed Mar. 13, 2002; Vyvoda et al., U.S. patent application Ser. No. 10/185,507, "Electrically Isolated Pillars in Active Devices," filed Jun. 27, 2002; Vyvoda, U.S. patent application Ser. No. 10/440,882, "Rail Schottky Device and Method of Making", filed May 19, 2003; and Cleeves et al., "Optimization of Critical Dimensions and Pitch of Patterned Features in and Above a Substrate," U.S. patent application Ser. No. 10/728,451, filed Dec. 5, 2003, all assigned to the assignee of the present invention and hereby incorporated by reference.

One embodiment of the present invention has been described herein in the context of a monolithic three dimensional memory array formed above a substrate. Such an array comprises at least a first memory level formed at a first height above the substrate and a second memory level formed at a second height different from the first height. Three, four, eight, or more memory levels can be formed above the substrate in such a multilevel array. Each memory level is monolithically formed on the memory level below it.

The memory cell formed in a monolithic three dimensional memory array has stacked memory levels, but such cells could clearly be formed in a two-dimensional array, as well. The example given showed the silicide layer formed above the junction diode, but those skilled in the art will appreciate that the silicide layer can be formed elsewhere: beside the junction diode or below it, for example. Many configurations can be imagined.

In an alternative embodiment, the resistor 8 is formed below the diode 4 in the pillar 300. In this embodiment, the resistor 8 is formed on the lower electrode 12. The decoupler conductive layer 6 is formed on the resistor 4. The diode 4 is then formed on the decoupler layer 6. The silicide crystallization template layer 124 may be formed in the contact with the diode either above or below the diode 4.

An alternative method for forming a similar array in which conductors are formed using Damascene construction is described in Radigan et al., U.S. patent application Ser. No. 11/444,936, "Conductive Hard Mask to Protect Patterned Features During Trench Etch," filed May 31, 2006, assigned to the assignee of the present invention and hereby incorporated by reference. The methods of Radigan et al. may be used instead to form an array according to the present invention.

The foregoing detailed description has described only a few of the many forms that this invention can take. For this reason, this detailed description is intended by way of illustration, and not by way of limitation. It is only the following claims, including all equivalents, which are intended to define the scope of this invention. All patents, patent applications and publications described herein are incorporated by reference in their entirety.

What is claimed is:

1. A nonvolatile memory device, comprising:
   a semiconductor diode steering element;
   a semiconductor read/write switching element; and
   a C49 phase crystallization template layer which directly physically contacts the steering element, wherein the steering element is crystallized in direct contact with the C49 phase crystallization template layer.

2. The device of claim 1, further comprising at least one conductive layer located between the steering element and the read/write switching element.

3. The device of claim 2, wherein the at least one conductive layer comprises a titanium nitride layer.

4. The device of claim 2, wherein the steering element, the at least one conductive layer and the read/write switching element are arranged in series and together comprise a nonvolatile memory cell.

5. The device of claim 4, further comprising a first electrode and a second electrode electrically contacting the nonvolatile memory cell.

6. The device of claim 5, wherein the read/write switching element comprises a resistor.

7. The device of claim 6, wherein:
the read/write switching element comprises amorphous, polycrystalline or a combination amorphous and polycrystalline Group IV semiconductor resistor;
the steering element comprises a crystallized polycrystalline Group IV semiconductor diode; and
the at least one conductive layer contacts both the steering element and the read/write switching element.

8. The device of claim 7, wherein the C49 phase titanium silicide crystallization template layer contacts the steering element which comprises a polysilicon diode.

9. The device of claim 5, wherein the read/write switching element and the steering element are arranged in a pillar between the first electrode and the second electrode.

10. The device of claim 5, wherein in use, the read/write switching element of the memory cell switches from a first resistivity state to a second resistivity state different from the first resistivity state in response to an applied electrical pulse.

11. The device of claim 10, wherein steering element does not switch from the first resistivity state to the second resistivity state in response to the applied electrical pulse.

12. The device of claim 11, wherein the steering element is formed in a low resistivity state which does not change in response to the applied electrical pulse and the read/write switching element is formed in a high resistivity state which changes in response to the applied electrical pulse.

13. The device of claim 12, wherein an application of a second electrical pulse is adapted to switch the read/write switching element from the second resistivity state to the first resistivity state.

14. A nonvolatile memory device, comprising:
a crystallized polycrystalline silicon, germanium or silicon germanium semiconductor diode steering element;
a titanium silicide, titanium germanide or titanium silicide-germanide crystallization template layer having a C49 phase in physical contact with the diode steering element;
a semiconductor resistor read/write switching element;
at least one metal, metal silicide or titanium nitride conductive layer located between the steering element and the read/write switching element;
a first electrode electrically contacting the steering element; and
a second electrode electrically contacting the read/write switching element;
wherein the read/write switching element, the at least one conductive layer and the steering element are arranged in series in a pillar between the first electrode and the second electrode.

15. The device of claim 14, wherein:
the device comprises a monolithic three dimensional nonvolatile memory device;
the read/write switching element comprises amorphous, polycrystalline or a combination amorphous and polycrystalline Group IV semiconductor resistor; and
the at least one conductive layer contacts the steering element and the read/write switching element.

* * * * *